(12) United States Patent
Oshikiri et al.

(10) Patent No.: US 7,460,042 B2
(45) Date of Patent: Dec. 2, 2008

(54) ENCODING CIRCUIT, DECODING CIRCUIT, ENCODER CIRCUIT, DECODER CIRCUIT, AND CABAC PROCESSING METHOD

(75) Inventors: Makoto Oshikiri, Ome (JP); Ryuji Sakai, Hanno (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/819,391

(22) Filed: Jun. 27, 2007

(65) Prior Publication Data

US 2008/0001796 A1   Jan. 3, 2008

(30) Foreign Application Priority Data

Jun. 29, 2006  (JP) .............................. 2006-179905

(51) Int. Cl.
*H03M 7/00* (2006.01)

(52) U.S. Cl. ......................................... 341/107; 341/50

(58) Field of Classification Search ................. 341/107, 341/60, 50, 51, 56; 704/205, 213, 212; 375/242, 375/240.01, 245
See application file for complete search history.

(56) References Cited

U.S. PATENT DOCUMENTS 6,014,186 A * 1/2000 Kim ....................... 375/240.26
6,356,213 B1 * 3/2002 Huang et al. .................. 341/60
6,675,144 B1 * 1/2004 Tucker et al. ............... 704/264

FOREIGN PATENT DOCUMENTS

| JP | 11-252549 | 9/1999 |
|---|---|---|
| JP | 2005-244503 | 9/2005 |
| JP | 2005-295526 | 10/2005 |

* cited by examiner

*Primary Examiner*—Peguy JeanPierre
(74) *Attorney, Agent, or Firm*—Pillsbury Winthrop Shaw Pittman, LLP

(57) ABSTRACT

According to one embodiment, an encoding circuit includes a taking-over unit which takes over probability tables of divided regions of a previous frame image of a frame image having divided regions to divided regions of a present frame image, respectively, an acquiring unit which acquires a parameter of an adjacent macro block of the previous frame image when the macro block is located on a boundary between the divided regions, a selecting unit which calculates the parameter of the macro block to select one of probability models in the probability table, and an encoding unit which arithmetically encodes a residual signal in the frame image on the basis of the selected probability model to generate an encoded bit string.

17 Claims, 6 Drawing Sheets

ENCODING CIRCUIT, DECODING CIRCUIT, ENCODER CIRCUIT, DECODER CIRCUIT, AND CABAC PROCESSING METHOD

CROSS-REFERENCE TO RELATED APPLICATIONS

This application is based upon and claims the benefit of priority from Japanese Patent Application No. 2006-179905, filed Jun. 29, 2006, the entire contents of which are incorporated herein by reference.

BACKGROUND

1. Field

One embodiment of the invention relates to an entropy encoding scheme which is called a CABAC (Context-Adaptive Binary Arithmetic Coding) used in H.264/AVC.

2. Description of the Related Art

In recent years, with dramatic development and penetration of broadband Internet, a high-quality communication method is desired. H.264/AVC is an international standard which is noted for a high compression rate. The H.264/AVC employs an entropy encoding scheme called CABAC (Context-Adaptive Binary Arithmetic Coding). Context-Adaptive, i.e., a scheme which adaptively selects an efficient context depending on the surrounding circumstances is employed. In this case, since the CABAC has a very high load on a general-purpose CPU as a characteristic feature, parallel processing is desirably performed.

Patent Document 1 (Jpn. Pat. Appln. KOKAI Publication No. 2005-244503) discloses a technique that, in an image information encoding apparatus which outputs image compression information based on an image encoding scheme such as H.264/AVC, even though necessary vector information or the like of an adjacent block for parallel processing such as pipeline processing cannot be obtained, a high-speed encoding process can be realized by generating and using pseudo information.

However, a conventional art of Patent Document 1 does not disclose the CABAC which is an issue of the present invention. For this reason, even though a person skilled in the art refers to the document, how to achieve high-speed parallel processing of the CABAC cannot be known.

More specifically, in the CABAC processing, since information of an adjacent macro block (to be referred to as an MB hereinafter) is used, a frame must be divided into a plurality of slices to perform parallel processing in the same frame. However, dependence of MBs on a slice boundary is eliminated due to the influence of the division, and for example, as described later with reference to FIG. 6, information of an adjacent MB belonging to another slice cannot be used. As a result, encoding efficiency is deteriorated. Similarly, as described later with reference to FIG. 5, since a probability table must be initialized for every slice, the encoding efficiency is deteriorated.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

DETAILED DESCRIPTION

Various embodiments according to the invention will be described hereinafter with reference to the accompanying drawings. In general, according to one embodiment of the present invention, there is provided an encoding circuit, a decoding circuit, an encoder circuit, a decoder circuit, and a CABAC processing method for performing high-speed CABAC processing of H.264/AVC.

One embodiment of the means for achieving the object is an encoding circuit comprising:

a taking-over unit (B1: S12) which takes over probability tables ($T1_{-1}$, $T2_{-1}$, $T3_{-1}$) of divided regions (U1, U2, U3) of a previous frame image of a frame image ($\ldots F_{-1}, F_0 \ldots$) having N divided regions (U1, U2, U3) continuously given at predetermined intervals to divided regions (U1, U2, U3) of a present frame image, respectively;

an acquiring unit (B2: S13, S14, S17) which acquires a parameter of an adjacent macro block ($MBP_{-1}$) of the previous frame image ($F_{-1}$) in calculation of a parameter of a macro block (MB) serving as a processing unit in the divided region when the macro block is located on a boundary between the divided regions;

a selecting unit (B3: S15) which calculates the acquired parameter of the adjacent macro block ($MBP_0$, $MBP_{-1}$) to select one of probability models (m1, m2, m3, m4, . . . ) in the probability table ($T1_{-1}$, $T2_{-1}$, $T3_{-1}$); and an encoding unit (B4: S16) which arithmetically encodes a residual signal in the frame image on the basis of the selected probability model (m1, m2, m3, m4, . . . ) to generate an encoded bit string (L).

In this manner, a frame image is divided for parallel processing, and a macro block on a boundary between divided images cannot obtain a parameter of an adjacent macro block.

However, by using a parameter of a macro block of a first previous frame image, a high-quality image is compensated. Furthermore, in general, although a probability table must be initialized for every divided region, when a probability table of a divided region of the first previous frame image is taken over, a high-quality image is compensated.

An embodiment of the present invention will be described below with reference to the accompanying drawings.

Figure 1:
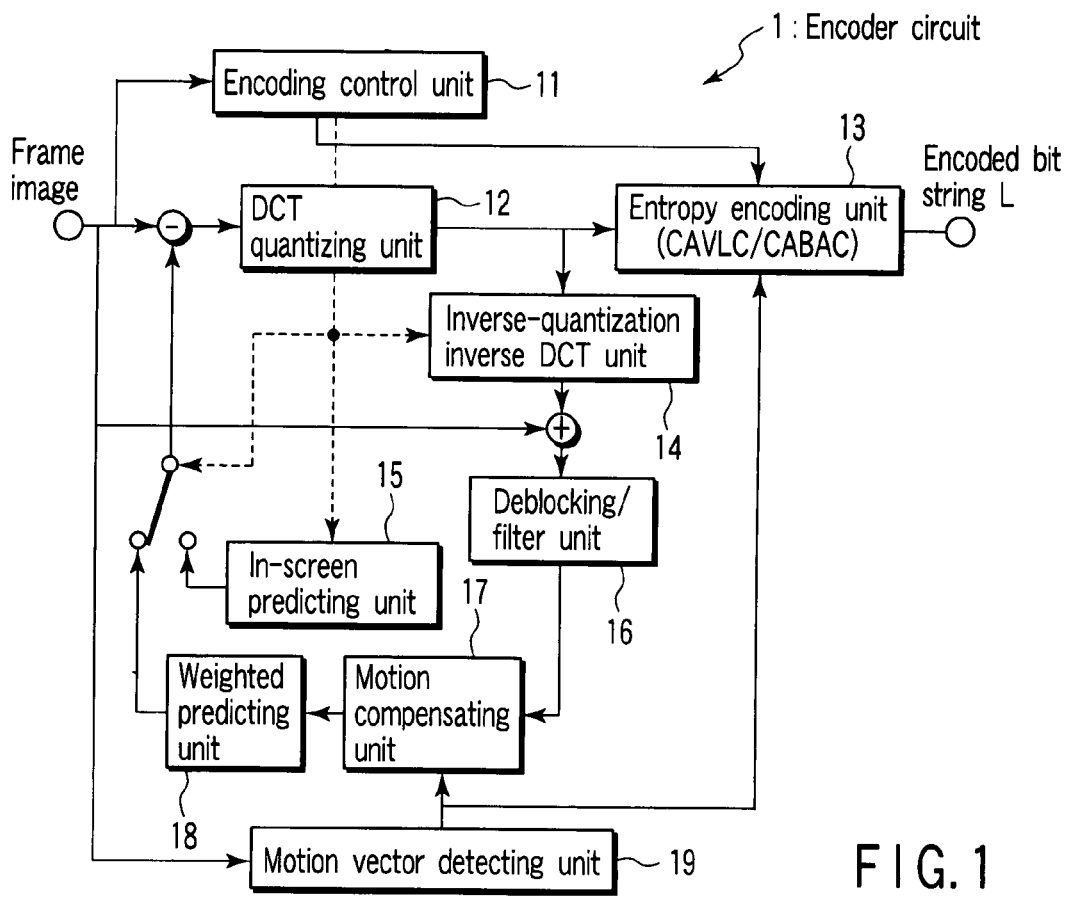
FIG. 1 is a circuit diagram showing an example of a configuration of an encoder circuit of H.264/AVC according to an embodiment of the present invention.
Figure 2:
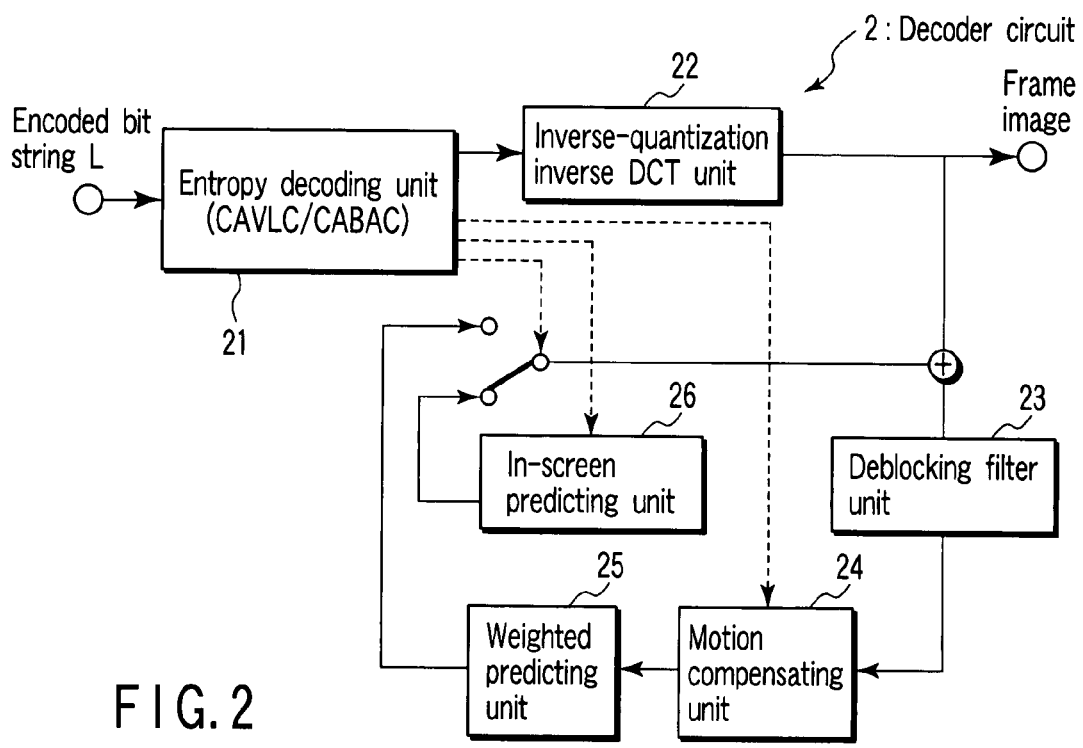
FIG. 2 is a circuit diagram showing an example of a configuration of a decoder circuit of H.264/AVC according to the embodiment of the present invention.
Figure 3:
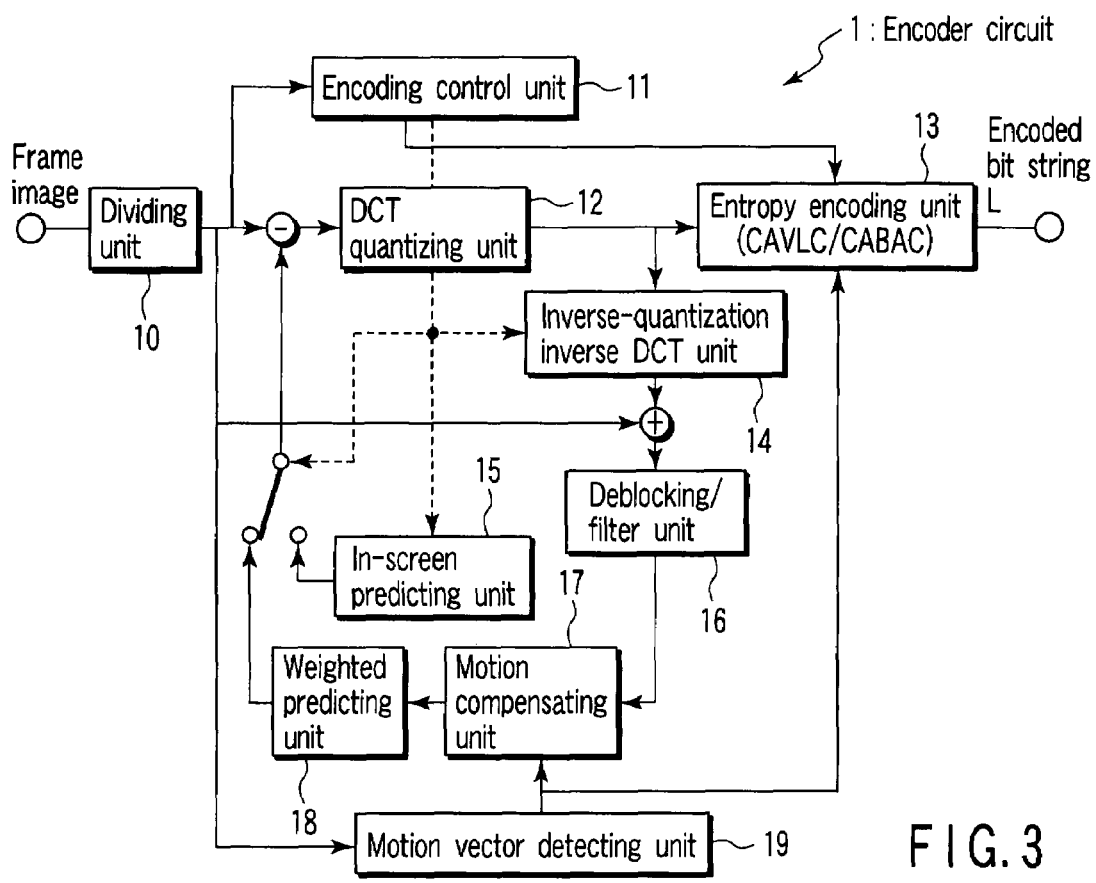
FIG. 3 is a circuit diagram showing an example of another configuration of the encoder circuit of H.264/AVC according to the embodiment of the present invention.
Figure 4:
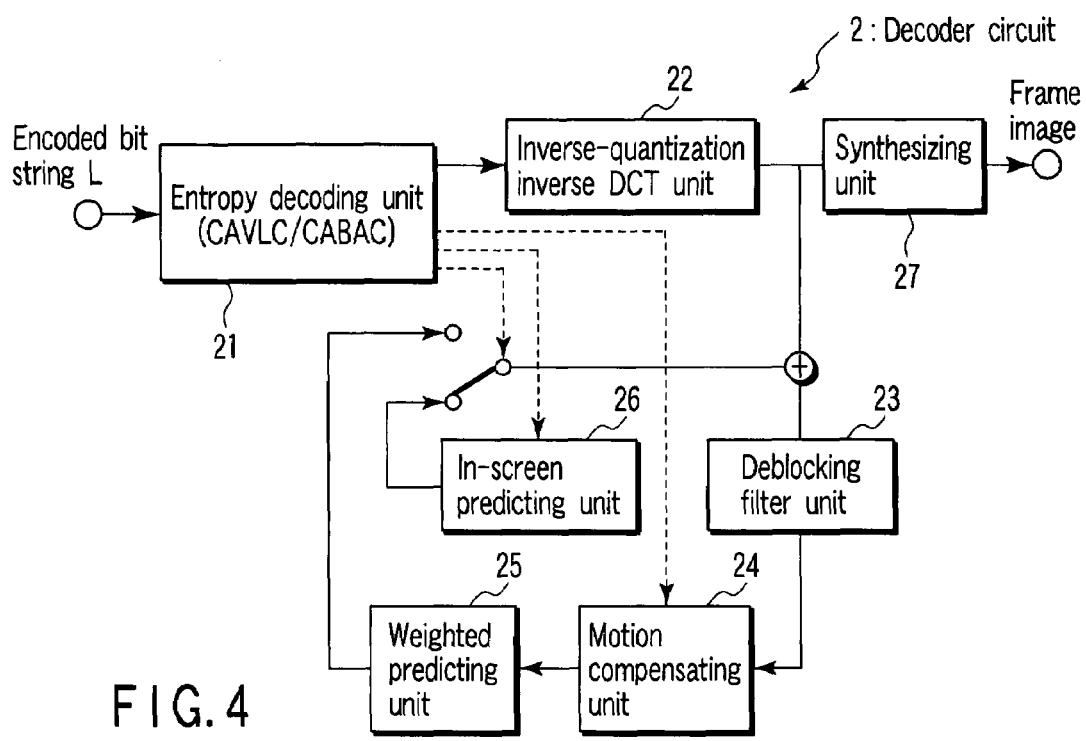
FIG. 4 is a circuit diagram showing an example of another configuration of the decoder circuit of H.264/AVC according to the embodiment of the present invention.
Figure 5:
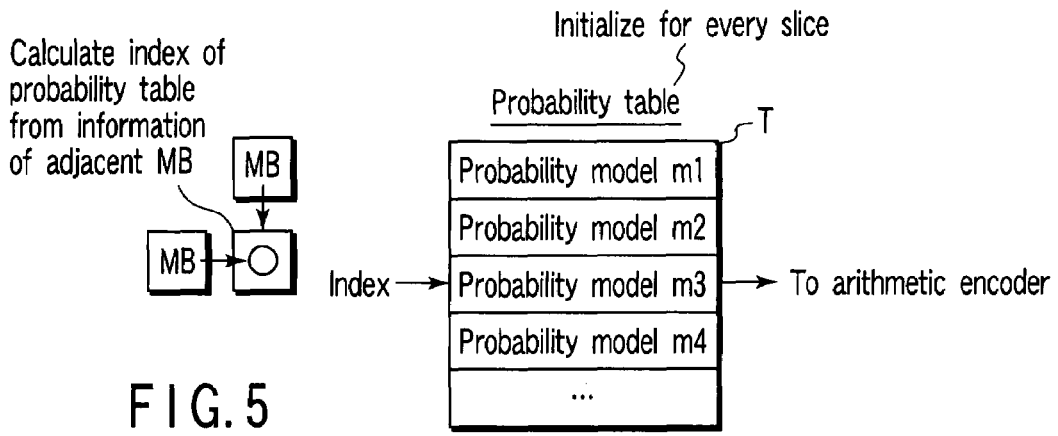
FIG. 5 is an explanatory diagram showing an example of context calculation of CABAC according to the embodiment of the present invention.
Figure 6:
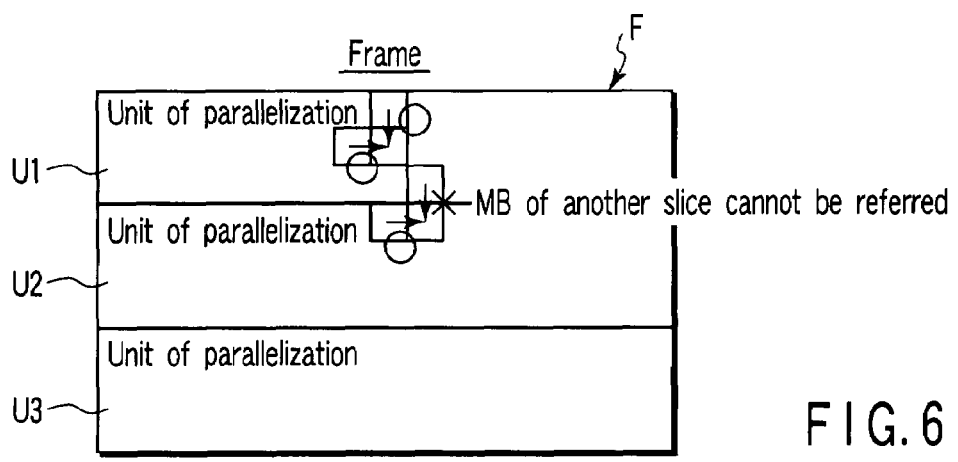
FIG. 6 is an explanatory diagram showing an example of context calculation referring to an adjacent MB of CABAC according to the embodiment of the present invention.

FIG. 1 is a circuit diagram showing an example of a configuration of an encoder circuit of H.264/AVC. FIG. 2 is a circuit diagram showing an example of a configuration of a decoder circuit of H.264/AVC. FIG. 3 is a circuit diagram showing an example of another configuration of the encoder circuit of H.264/AVC. FIG. 4 is a circuit diagram showing an example of another configuration of the decoder circuit of H.264/AVC. FIG. 5 is an explanatory diagram showing an example of context calculation of CABAC. FIG. 6 is an explanatory diagram showing an example of context calculation referring to an adjacent MB of CABAC.

Figure 10:
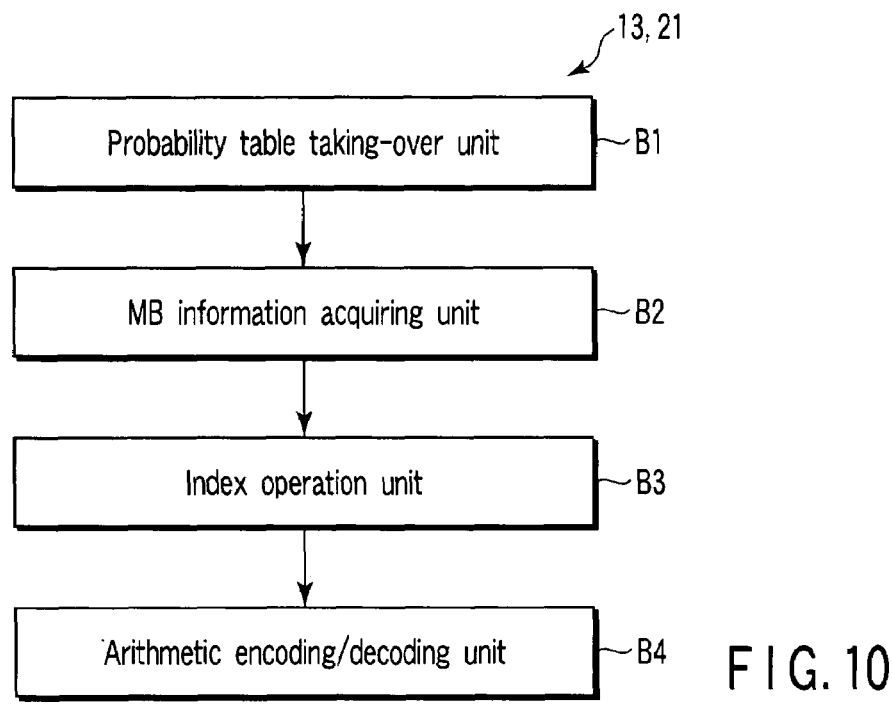
FIG. 10 is a block diagram showing an example of the context calculation using the previous frame of CABAC according to the embodiment of the present invention.
Figure 7:
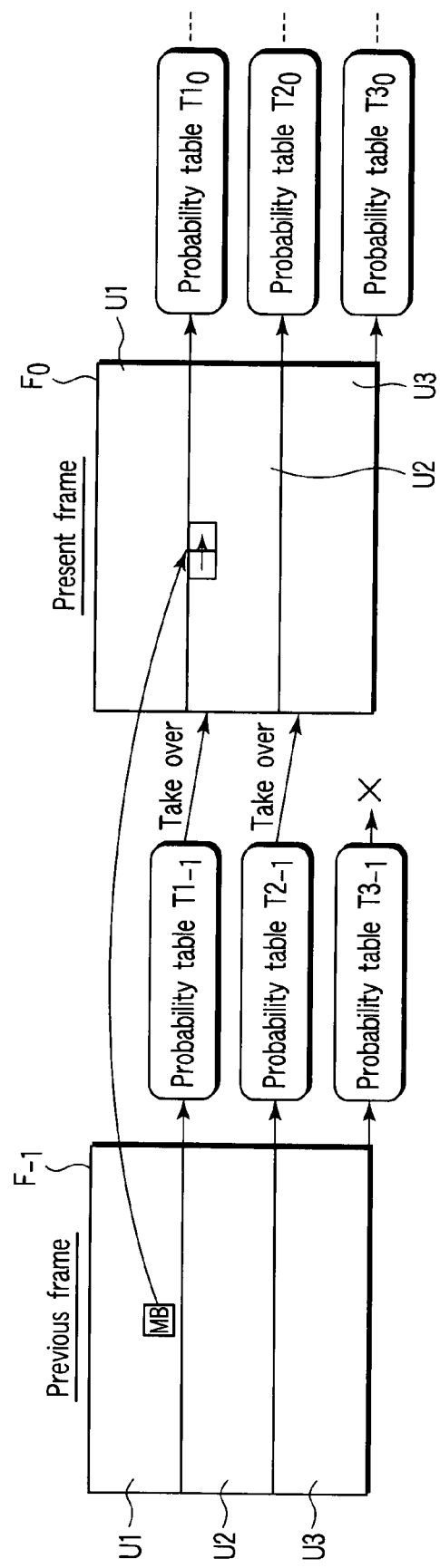
FIG. 7 is an explanatory diagram showing an example of context calculation using a previous frame of CABAC according to the embodiment of the present invention.
Figure 8:
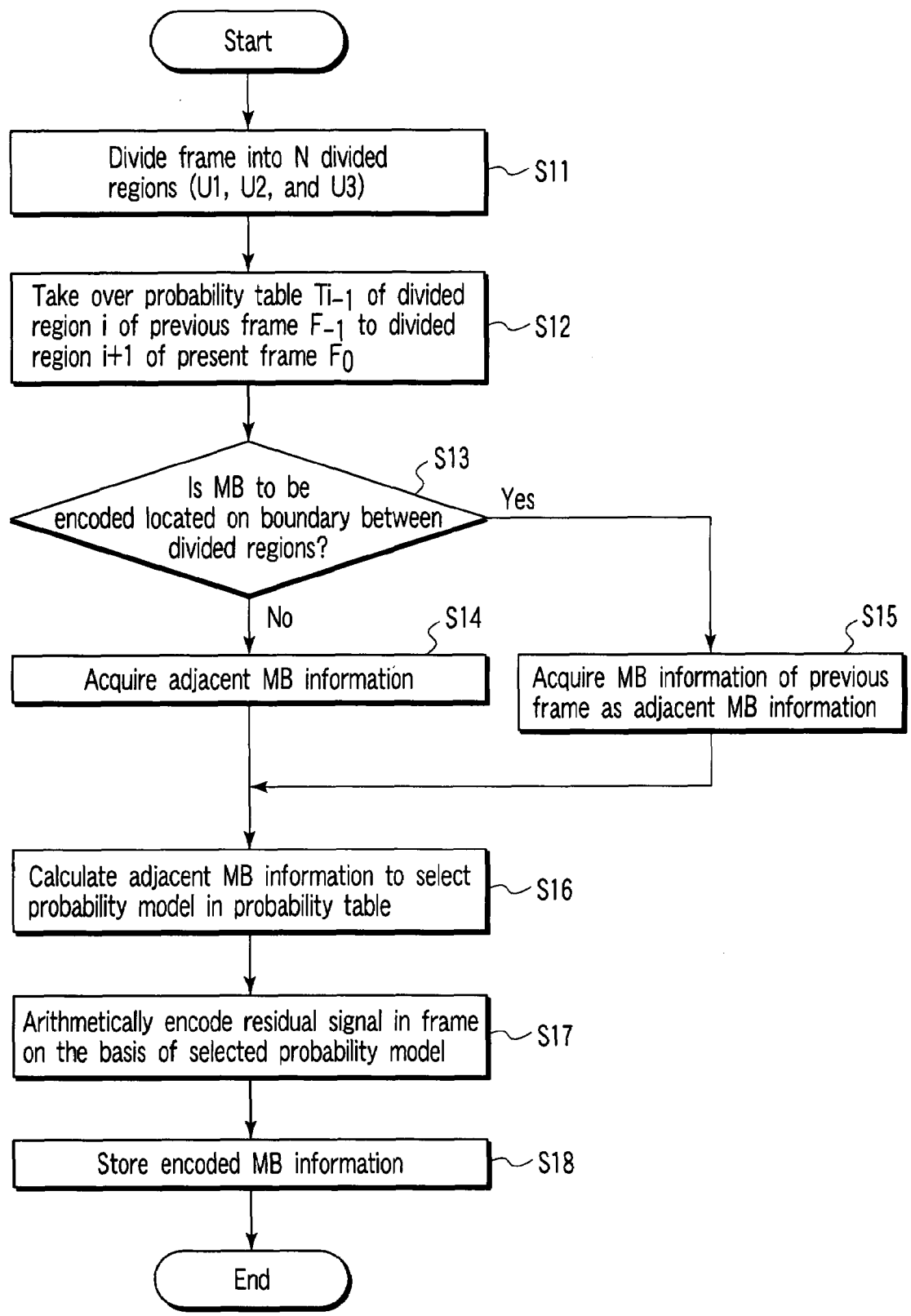
FIG. 8 is a flow chart showing an example of the context calculation and an encoding process using the previous frame of CABAC according to the embodiment of the present invention.
Figure 9:
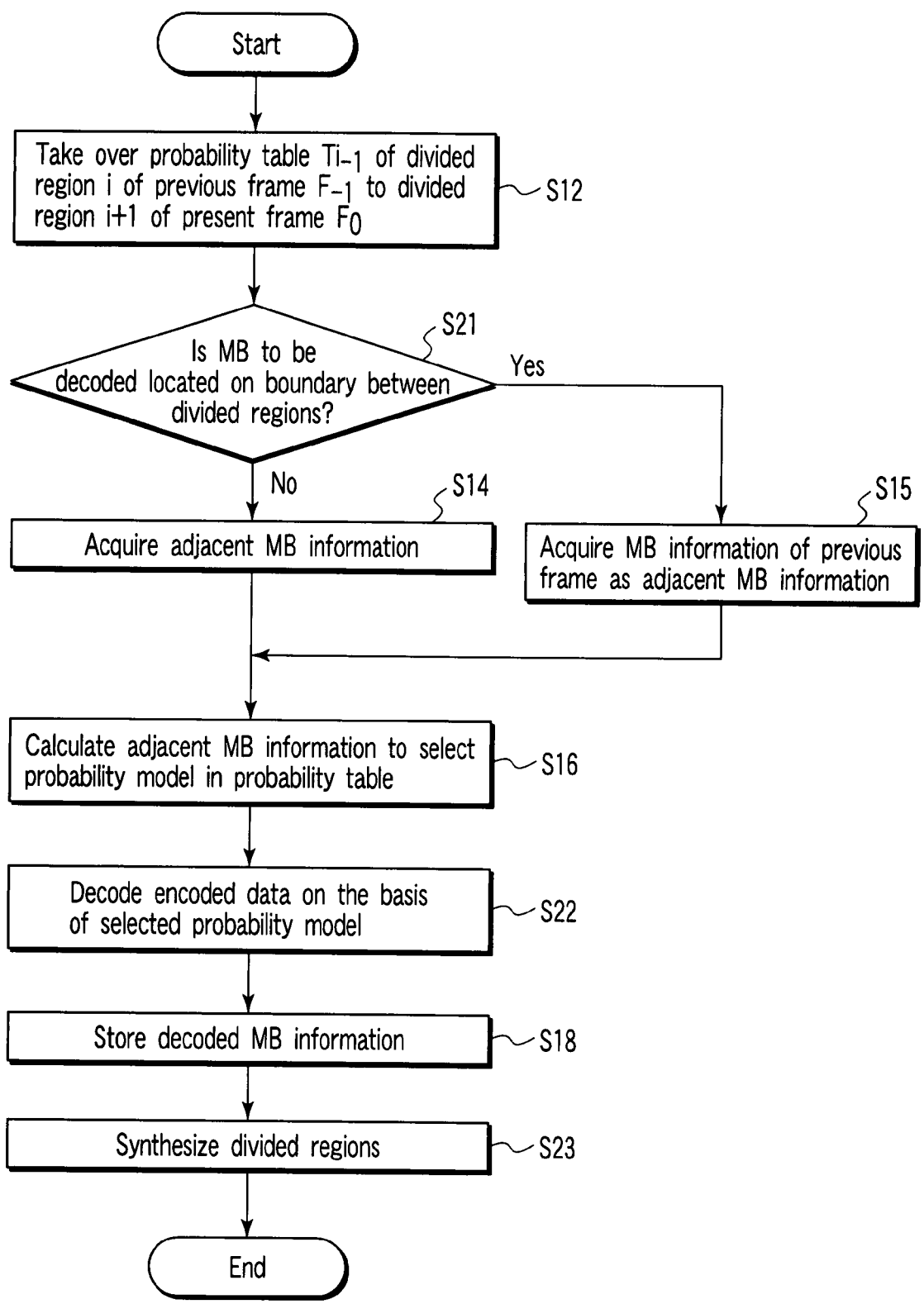
FIG. 9 is a flow chart showing an example of the context calculation and a decoding process using the previous frame of CABAC according to the embodiment of the present invention.

FIG. 7 is an explanatory diagram showing an example of context calculation using a previous frame of CABAC. FIG. 8 is a flow chart showing an example of the context calculation and an encoding process using the previous frame of CABAC. FIG. 9 is a flow chart showing an example of the context calculation and a decoding process using the previous frame of CABAC. FIG. 10 is a block diagram showing an example of the context calculation using the previous frame of CABAC.

EXAMPLE OF ENCODER CIRCUIT/DECODER CIRCUIT INCLUDING CABAC ACCORDING TO ONE EMBODIMENT OF PRESENT INVENTION (Configuration and Operation of Encoder Circuit)

An encoder circuit 1 including CABAC according to an embodiment of the present invention, as shown in FIG. 1, includes an encoding control unit 11 to which a frame image is supplied, a DCT quantizing unit 12 operated through a subtractive operator, and an entropy encoding unit 13 which receives quantization data from the DCT quantizing unit 12. Furthermore, the encoder circuit 1 includes an inverse-quantization inverse DCT unit 14 which receives an output from the DCT quantizing unit 12, a deblocking/filter unit 16 which receives the output through an addition operator which adds a frame image, a motion compensating unit 17 which receives the output, a weighted predicting unit 18 which receives the output, and an in-screen predicting unit 15. The encoder circuit 1 has a motion vector detecting unit 19 which receives the frame image. An output from the motion vector detecting unit 19 is supplied to the motion compensating unit 17.

In the encoder circuit 1 having such configuration, a frame image is quantized by the DCT quantizing unit 12, and the quantized frame image is supplied to the entropy encoding unit 13. A motion vector detected by the motion vector detecting unit 19, to which the frame image is supplied, is supplied to the motion compensating unit 17 and supplied to the weighted predicting unit 18. The motion vector and a signal from the in-screen predicting unit 15 are properly switched, and the motion vector signal is added to the previous quantization data. The resultant data is supplied to the entropy encoding unit 13.

In the entropy encoding unit 13, an encoding process by CAVLC or CABAC is performed in response to an operation timing from the encoding control unit 11, and quantizing data is encoded to output an encoded bit string including a motion vector component.

(Configuration and Operation of Decoder Circuit)

A decoder circuit 2 including CABAC according to the embodiment of the present invention, as shown in FIG. 2, includes an entropy decoding unit 21 which receives an encoded bit string, an inverse-quantization inverse DCT unit 22 which receives an output from the entropy decoding unit 21, a deblocking filter unit 23 which receives an output from the inverse-quantization inverse DCT unit 22 through an addition operator, a motion compensating unit 24 which receives an output from the deblocking filter unit 23, a weighted predicting unit 25 which receives the output, and an in-screen predicting unit 26 the operation of which is controlled by the entropy decoding unit 21. The outputs from the weighted predicting unit 25 and the in-screen predicting unit 26 are selectively supplied to the addition operator by a switch.

In the decoder circuit 2 having such configuration, the encoded bit string including a motion vector component is decoded by the entropy decoding unit 21 into a frame image having a motion vector component. The motion vector component is supplied to the motion compensating unit 24, and weighting is performed by the weighted predicting unit depending on the motion vector component. An output from the motion compensating unit 24 and an output from the in-screen predicting unit 26 are appropriately switched by a switch, so that an appropriate output is supplied to the deblocking filter unit 23.

In this manner, the encoded bit string is decoded, and the decoded signal is output from an output terminal as a frame image.

(Configuration and Operation of CABAC)

In the embodiment of the encoder circuit 1 and the decoder circuit 2 having the above configuration, especially, a parallel operation of CABAC of the entropy encoding unit 13 and the entropy decoding unit 21 will be described below in detail with reference to the drawings.

Principle

H.264/AVC employs an entropy encoding scheme called CABAC (Context-Adaptive Binary Arithmetic Coding). As the CABAC, Context-Adaptive, i.e., a scheme which adaptively selects an efficient context depending on surrounding circumstances is employed. This scheme is shown in FIG. 5. As shown in FIG. 5, when information of an adjacent MB is reflected, a probability model having high encoding efficiency can be selected.

Since CABAC has a high load on a general-purpose CPU as a characteristic feature, parallel processing can be said to be desired. However, since CABAC uses information of an adjacent MB, a frame must be divided into a plurality of slices to perform parallel processing in the same frame. However, dependence of MBs on a slice boundary is eliminated due to the influence of the division, and for example, as shown in FIG. 6, information of an adjacent MB belonging to another slice cannot be used. As a result, encoding efficiency is deteriorated. Similarly, since a probability table T in FIG. 5 must be initialized for every slice, the probability table is not optimized in one frame to deteriorate the encoding efficiency.

Therefore, as shown in FIG. 7, in the embodiment of the present invention, focusing attention on temporal dependence, a method of taking over probability tables $T1_{-1}$ and $T2_{-1}$ of a previous frame $F_{-1}$ into probability tables $T2_0$ and $T3_0$ of a present frame $F_0$ is employed. In this manner, for example, a divided frame U2 need not wait until a probability table serving as a result of a probability table updating process of a divided frame U1 is obtained. The probability table updating process is performed for each macro block. Therefore, also in the probability table updating process, parallel processing can be performed in each of a plurality of divided frames.

As a reference MB in context calculation, as shown in FIG. 7, an MB of a previous frame is used. In this manner, parallel processing of MBs in the same frame can be performed without degrading encoding efficiency. At this time, when units for parallelization in each frame are made equal to each other, probability tables between frames can be taken over without any loss.

Explanation by Flow Chart and Block Diagram

A parallel operation of CABAC according to the embodiment and processing of context calculation of CABAC according to the embodiment of the present invention will be described in further detail by using flow charts in FIGS. 8 and 9 and a block diagram in FIG. 10.

A given image frame is divided by N at first. The image frame may be divided by two, three, or more. For example, parallel processing can be performed by two or three CPUs. In this case, the dividing process of the image frame, as shown in FIGS. 3 and 4, may be performed by a dividing unit 10, a synthesizing unit 27, and the like previous to the encoder circuit 1.

Furthermore, the dividing process may be preferably performed as in step S11 in FIG. 8 in the entropy encoding unit 13 or may be preferably performed as in step S22 in FIG. 9 in the entropy decoding unit 21.

A probability table of a divided region i of a previous frame is taken over to a divided region i+1 of the present frame (step S12).

In general, moving image has strong temporal dependence, and thus pieces of temporally continuous information in one frame can be said to be considerably resembled. For this reason, even though a probability table taken over from a previous MB in the same frame is replaced with a probability table at the same position of the previous frame, encoding efficiency is hardly influenced.

When the probability table of the previous frame is taken over, the frame need not wait for processing of a first previous MB, and MBs in the same frame can be performed in parallel. In a moving image format such as H.264, a backward frame such as a B picture may be used in encoding. However, the use of the backward frame in another embodiment (will be described later) supposes this case.

It is determined whether an MB to be encoded (decoded) is located at a boundary between divided regions (steps S13 and S21). As also explained in FIG. 6, when the divided regions U1, U2, and U3 are parallel processed, an MB located on a boundary between the divided regions cannot refer to an adjacent MB. In this case, MB information of a previous frame is used to improve prediction accuracy.

In this case, when an MB to be encoded currently is not located on the boundary, adjacent MB information of the present frame is acquired (step S14). In this case, as in the next case, MB information of the previous frame is preferably acquired and used.

On the other hand, when the MB to be encoded currently is located on the boundary, adjacent MB information of the previous frame is acquired (step S15).

On the basis of the acquired information such as a parameter of the adjacent MB, a probability model to be used in probability models m1, ..., m4 ... in a probability table T is selected (step S16). More specifically, an index indicating the probability model to be used in the probability table is calculated by a calculation result, so that one probability model to be used is selected.

On the basis of the selected probability model, a residual signal in a given frame image is arithmetically encoded to output an encoded bit string L.

As in a case in which a decoding process of CABAC is performed in the entropy decoding unit 21, as shown in the flow chart in FIG. 9, only partially different parts will be described. More specifically, in step S21, it is determined whether an MB to be decoded is located on a boundary between divided region, and an adjacent MB is acquired.

In step S22, encoded data given to the entropy decoding unit 21 is decoded on the basis of the selected probability model.

In step S23, output data in divided regions are synthesized with each other.

Furthermore, in FIG. 10, processing circuits which perform processing in the entropy encoding unit 13 and the entropy decoding unit 21 are shown as a block diagram. More specifically, each of the processing circuits in the entropy encoding unit 13 and the entropy decoding unit 21 has a probability table taking-over unit B1, an MB information acquiring unit B2, an index operation unit B3, and an arithmetic encoding/decoding unit B4. In this case, each of these configurations has functions shown in the flow charts in FIGS. 8 and 9.

ANOTHER EMBODIMENT

In the above embodiment, in order to promote the efficiency of parallel processing, an MB of a forward frame corresponding to an upper adjacent position is referred. However, in order to improve encoding efficiency, a MB located around the MB (for example, an MB corresponding to its own position) is preferably referred.

In the above embodiment, a forward frame is used to promote the efficiency of parallel processing. However, in order to improve encoding efficiency, a backward frame is preferably referred.

According to the embodiment of the invention as described above in detail, in a CABAC context calculating unit, by using dependence on a previous frame, parallel processing of CABAC can be efficiently performed without deteriorating encoding efficiency.

With the above described various embodiments, a person skilled in the art can realize the present invention. Furthermore, various modifications of these embodiments can be easily conceived by the person skilled in the art. A person can apply the present invention to various embodiments without having inventive abilities. Therefore, the present invention extends over a wide scope consistent with the disclosed principle and novel characteristic features and is not limited to the embodiments described above.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An encoding circuit comprising:
   a taking-over unit which takes over probability tables of divided regions of a previous frame image of a frame image having N divided regions continuously given at predetermined intervals to divided regions of a present frame image, respectively;

an acquiring unit which acquires a parameter of an adjacent macro block of the previous frame image in calculation of a parameter of a macro block serving as a processing unit in the divided region when the macro block is located on a boundary between the divided regions;

a selecting unit which calculates the acquired parameter of the adjacent macro block to select one of probability models in the probability table; and an encoding unit which arithmetically encodes a residual signal in the frame image on the basis of the selected probability model to generate an encoded bit string.

2. The encoding circuit according to claim 1, further comprising:

a dividing unit which divides the frame image into the N divided regions when the frame image is given.

3. The encoding circuit according to claim 1, wherein the acquiring unit acquires a parameter of an adjacent macro block of the present frame image when the macro block is not located on the boundary between the divided regions.

4. The encoding circuit according to claim 1, wherein the acquiring unit acquires a parameter of an adjacent macro block of the previous frame image when the macro block is not located on the boundary between the divided regions.

5. A decoding circuit comprising:

a taking-over unit which takes over probability tables of divided regions of a previous frame image of a frame image having N divided regions continuously given at predetermined intervals to divided regions of a present frame image, respectively;

an acquiring unit which acquires a parameter of an adjacent macro block of the previous frame image in calculation of a parameter of a macro block serving as a processing unit in the divided region when the macro block is located on a boundary between the divided regions;

a selecting unit which calculates the acquired parameter of the adjacent macro block to select one of probability models in the probability table; and a decoding unit which arithmetically decodes a given encoded bit string on the basis of the selected probability model to output a residual signal in the frame image.

6. The decoding circuit according to claim 5, further comprising:

a synthesizing unit which synthesizes the residual signal output from the decoding unit with another residual signal of the divided region.

7. The decoding circuit according to claim 5, wherein the acquiring unit acquires a parameter of an adjacent macro block of the present frame image when the macro block is not located on the boundary between the divided regions.

8. The decoding circuit according to claim 5, wherein the acquiring unit acquires a parameter of an adjacent macro block of the previous frame image when the macro block is not located on the boundary between the divided regions.

9. An encoder circuit comprising:

a quantizing unit which quantizes a given frame image to output quantization information;

a detecting unit which detects motion vector information from the given frame image;

a taking-over unit which takes over probability tables of divided regions of a previous frame image of a frame image having N divided regions continuously given at predetermined intervals to divided regions of a present frame image, respectively;

an acquiring unit which acquires a parameter of an adjacent macro block of the previous frame image in calculation of a parameter of a macro block serving as a processing unit in the divided region when the macro block is located on a boundary between the divided regions; and a selecting unit which calculates the acquired parameter of the adjacent macro block to select one of probability models in the probability table; and an encoding unit which arithmetically encodes a residual signal of quantization information from the quantizing unit to generate an encoded bit string together with the motion vector information detected by the detecting unit, on the basis of the selected probability model.

10. The encoder circuit according to claim 9, further comprising:

a dividing unit which divides the frame image into the N divided regions when the frame image is given.

11. The encoder circuit according to claim 9, wherein the acquiring unit acquires a parameter of an adjacent macro block of the present frame image when the macro block is not located on the boundary between the divided regions.

12. The encoder circuit according to claim 9, wherein the acquiring unit acquires a parameter of an adjacent macro block of the previous frame image when the macro block is not located on the boundary between the divided regions.

13. A decoder circuit comprising:

a taking-over unit which takes over probability tables of divided regions of a previous frame image of a frame image having N divided regions continuously given at predetermined intervals to divided regions of a present frame image, respectively;

an acquiring unit which acquires a parameter of an adjacent macro block of the previous frame image in calculation of a parameter of a macro block serving as a processing unit in the divided region when the macro block is located on a boundary between the divided regions;

a selecting unit which calculates the acquired parameter of the adjacent macro block to select one of probability models in the probability table;

a CABAC decoding circuit having a decoding unit which arithmetically decodes a given encoded bit string on the basis of the selected probability model to output a residual signal and motion vector information in the frame image;

an inverse quantizing unit which inversely quantizes and outputs the residual signal output from the CABAC decoding unit; and a motion compensating unit which generates an image signal based on the motion vector information output from the CABAC decoding circuit to output the image signal together with the residual signal.

14. The decoder circuit according to claim 13, further comprising:

a synthesizing unit which synthesizes the residual signal output from the decoding unit with another residual signal of the divided region.

15. The decoder circuit according to claim 13, wherein the acquiring unit acquires a parameter of an adjacent macro block of the present frame image when the macro block is not located on the boundary between the divided regions.

16. The decoder circuit according to claim 13, wherein the acquiring unit acquires a parameter of an adjacent macro block of the previous frame image when the macro block is not located on the boundary between the divided regions.

17. A CABAC processing method comprising:

taking over probability tables of divided regions of a previous frame image of a frame image having N divided regions continuously given at predetermined intervals to divided regions of a present frame image, respectively;

acquiring a parameter of an adjacent macro block of the previous frame image in calculation of a parameter of a macro block serving as a processing unit in the divided region when the macro block is located on a boundary between the divided regions;

calculating the acquired parameter of the adjacent macro block to select one of probability models in the probability table;

arithmetically encoding a residual signal in the frame image on the basis of the selected probability model to generate an encoded bit string; and when another encoded bit string is given, decoding the another encoded bit string on the basis of the selected probability model to generate a residual signal.

* * * * *